United States Patent [19]
Wiste et al.

[11] Patent Number: 5,165,985
[45] Date of Patent: Nov. 24, 1992

[54] METHOD OF MAKING A FLEXIBLE, TRANSPARENT FILM FOR ELECTROSTATIC SHIELDING

[75] Inventors: Orville M. Wiste, Round Rock; Santosh Collison, Cedar Park; Vijay A. Kumar, Round Rock, all of Tex.

[73] Assignee: Minnesota Mining and Manufacturing Company, St. Paul, Minn.

[21] Appl. No.: 722,923

[22] Filed: Jun. 28, 1991

[51] Int. Cl.⁵ ............................................. B32B 9/00
[52] U.S. Cl. .................................. 428/209; 428/922; 428/901; 156/276; 174/35; 174/35 R; 174/52.1
[58] Field of Search ............... 428/209, 174, 922, 353; 206/328; 156/276; 174/35, 5 R

[56] References Cited

U.S. PATENT DOCUMENTS

| | | | |
|---|---|---|---|
| 3,572,499 | 3/1971 | Mondano | 206/1 |
| 3,801,418 | 4/1974 | Cornelis et al. | 161/43 |
| 3,888,711 | 6/1975 | Breitner | 156/93 |
| 4,154,344 | 5/1979 | Yenni, Jr. et al. | 206/524 |
| 4,156,751 | 5/1979 | Yenni, Jr. et al. | 428/212 |
| 4,208,696 | 6/1980 | Lindsay et al. | 361/212 |
| 4,326,003 | 4/1982 | Bouhaniche | 428/209 |
| 4,407,872 | 10/1983 | Horli | 428/35 |
| 4,471,872 | 9/1984 | Dedow | 206/328 |
| 4,528,222 | 7/1985 | Rzepecki et al. | 428/35 |
| 4,623,594 | 11/1986 | Keough | 428/500 |
| 4,645,566 | 2/1987 | Kato et al. | 162/138 |
| 4,658,958 | 4/1987 | McNulty et al. | 206/328 |
| 4,756,414 | 7/1988 | Mott | 206/328 |
| 4,875,581 | 10/1989 | Ray et al. | 206/328 |
| 4,899,521 | 2/1990 | Havens | 206/328 |
| 4,906,494 | 3/1990 | Babinec et al. | 428/35.2 |
| 4,939,027 | 7/1990 | Dalmon et al. | 428/284 |
| 4,957,943 | 9/1990 | McAllister et al. | 521/64 |
| 4,983,452 | 1/1991 | Delmon et al. | 428/287 |
| 4,992,329 | 2/1991 | Ishii et al. | 428/328 |
| 5,028,490 | 7/1991 | Koskenmaki | 428/594 |

FOREIGN PATENT DOCUMENTS

| | | |
|---|---|---|
| 59-190829 | 10/1984 | Japan . |
| 60-34099 | 2/1985 | Japan . |
| 60-81900 | 5/1985 | Japan . |
| 60-143699 | 7/1985 | Japan . |
| 60-210667 | 10/1985 | Japan . |
| 60-257234 | 12/1985 | Japan . |
| 62-47200 | 2/1987 | Japan . |
| 62-122300 | 6/1987 | Japan . |
| 62-275727 | 11/1987 | Japan . |
| 64-38398 | 8/1989 | Japan . |
| 2-276297 | 11/1990 | Japan . |

OTHER PUBLICATIONS

EIA Standard No. 541, "Packaging Material Standards for ESD Sensitive Items" (publication date Jun. 1988).
Japanese application 62-42499 Feb. 24, 1987.

*Primary Examiner*—Patrick J. Ryan
*Assistant Examiner*—W. Krynski
*Attorney, Agent, or Firm*—Gary L. Griswold; Walter N. Kirn; Jack V. Musgrove

[57] ABSTRACT

A method of making a flexible, transparent film providing electrostatic shielding by applying a plurality of thin, conductive slivers to a sheet having a dimensionally stable layer and a thermoplastic layer, the slivers being applied to the thermoplastic layer, and then laminating a cover sheet over the thermoplastic layer, the cover sheet being formed of the same material as the thermoplastic layer. The thermoplastic layer is heated to its melting pint, and the cover sheet is extruded and laminated in a molten state whereby the cover sheet blends with the thermoplastic layer to form a single, homogenous layer. The slivers form an essentially two-dimensional, conductive network which is suspended in the homogenous layer.

20 Claims, 2 Drawing Sheets

METHOD OF MAKING A FLEXIBLE, TRANSPARENT FILM FOR ELECTROSTATIC SHIELDING

BACKGROUND OF THE INVENTION

1. Field of the Invention

The present invention generally relates to processes for manufacturing sheeting material, and more particularly to a process for manufacturing a flexible, transparent film which shields against electrostatic fields, and further resists triboelectric generation of static charges and provides for the rapid dissipation of such charges.

2. Description of the Prior Art

Electrostatic discharge, as well as the mere presence of a static electric field, can be extremely detrimental to sensitive electronic parts. This is particularly true of modern semiconductors and integrated circuits which may be degraded or destroyed by the buildup of static electricity in the workplace. Especially sensitive components can be severely affected by an electrical potential as small as 50 volts, yet the simple act of walking has been shown to triboelectrically generate a potential of 30,000 volts or more.

One of the most common methods of protecting electronic components is to store, ship and handle them using pouches, bags, tote boxes or other packaging constructed of materials which provide shielding against electrostatic fields and other electromagnetic influences. These materials may additionally provide for the rapid dissipation of electrostatic charges which are applied to the package, and/or include a coating which prevents or minimizes triboelectric charging along the surface of the package. The present invention is directed to a process for manufacturing a film which may be fashioned into packaging providing such protection.

The most basic function provided by these types of films is protection from static electric fields. This is typically achieved by forming a conductive layer on the film or dispersing conductive materials therein, which effectively creates a Faraday cage. An example of a rather complicated process for creating a shielding film is disclosed in U.S. Pat. No. 4,645,566 issued to Kato et al. A thermoplastic, synthetic pulp is mixed with thermoplastic, composite fibers and conductive fibers, resulting in a paper-type stock. This stock may be formed into a web, and when it is heated and dried at appropriate temperatures, the pulp melts, leaving a film which has a network of conductive fibers dispersed therein. Other processes using a pulp of polymeric and conductive components are discussed in Japanese Patent Application Kokai Nos. 60-210667, 60-257234 and 62-42499.

The use of a web carrier in creating a conductive intermediate layer is common. In U.S. Pat. Nos. 4,939,027 and 4,983,452, both issued to Daimon et al., a moldable static-shielding sheet is formed by first obtaining a web of nonwoven fabric comprising conductive fibers and thermoplastic fibers. The web may alternatively be formed by irregularly twining a conductive fiber with a hot-melt adhesive fiber. The web is placed between two thermoplastic films and heated. This bonds the films to the web, and further causes the thermoplastic fibers in the web to melt and combine with the films, leaving an imbedded layer of conductive fibers. Other techniques utilizing a web or fabric are shown in Japanese Patent Application Kokai Nos. 60-34099, 60,143699, 62-47200, 62-122300, 62-275727, and 62-276297.

In addition to providing electrostatic shielding, these films may be treated to provide for the rapid dissipation of static charges, and to further minimize the triboelectric generation of such charges. In accordance with the American National Standards Institute EIA standard 541 ("Packaging Material Standards for ESD Sensitive Items," published June 1988) the first of these qualities is referred to as static-dissipative, and the latter is referred to as antistatic. For example, U.S. Pat. No. 4,623,594 issued to A. Keough teaches the use of an electron-beam curable resin composition which may be applied to a substrate, and which causes the antistatic properties to migrate through the substrate upon curing.

One product which combines the qualities of electrostatic shielding, static-dissipation and triboelectric charge resistance is described in U.S. Pat. Nos. 4,154,344 and 4,156,751, both issued to Yenni et al. Those patents describe a sheeting material which is formed by first applying a conductive material, such as nickel, to one surface of a biaxially oriented polymer substrate, namely, polyester. The exposed nickel surface is then coated by a solvent process with a protective layer. A film of heat-sealable material (polyethylene) is extruded onto the opposite surface of the polyester film. The extruded polyethylene may include antistatic material (such as quaternary ammonium compounds), or be further coated with such antistatic agents. Other conductive materials, such as carbon-loaded plastics, may be substituted for the metallic coating.

A similar product and process is described in U.S. Pat. No. 4,756,414 issued to C. Mott, except that the conductive layer is provided between the heat-sealable plastic and the second plastic layer. The conductive layer is applied by either vacuum deposition or sputtering techniques. The two plastic layers may be joined using a thermosetting adhesive. See also Japanese Patent Kokoku No. 38398/89. In U.S. Pat. No. 4,875,581 issued to Ray et al., a dielectric material is interposed between the two plastic layers and, in addition to a conductive layer, the outer elastomeric layer of the film includes additives which make it static-dissipative. Even more complicated processes and resulting structures are known, such as the film discussed in U.S. Pat. No. 4,906,494 issued to Babinec et al., which utilizes a two-ply layer having a polyolefin and a copolymer of ethylene-acrylic acid and ethylene-vinyl acetate. In Babinec, the layers are joined using an adhesive or hot roll lamination.

Another laminated film is disclosed in U.S. Pat. No. 3,888,711 issued to W. Breitner. Although that film is primarily intended for use as a heated window or alarm glass, Breitner notes that it may also be used for shielding against electromagnetic interference. The lamination process used requires a knit of thermoplastic and conductive filaments which is applied to a sheet of thermoplastic material. The thermoplastic filaments are preferably constructed of the same materials as the thermoplastic sheet; the thermoplastic filaments should at least be fusible with the sheet. When the sheet is fed through hot rolls, the thermoplastic filaments fuse with the sheet, leaving a network of conductive filaments forming a plurality of interconnected conductive paths. A cover sheet may be laid on top of the network before hot rolling. Another lamination technique (using conductive strands rather than a web) is depicted in Japanese Patent Application Kokai No. 60-81900.

Each of the foregoing techniques has its disadvantages. First and foremost of these is the poor transmission of visible light ("transmissivity") through these films and packaging formed therefrom, whether they rely on metal coatings, carbon-loading or filament networks. Previously, increasing transmissivity meant sacrificing static-shielding ability. The best transmissivity claimed by any of the foregoing processes is 60%, although this has proven very difficult to achieve at production levels. Furthermore, while this level of transmissivity allows a visual inspection of the general condition of items contained in the packaging, it does not provide adequate legibility, i.e., the ability to read printed matter on the item in the packaging, particularly if the printing is not flush against the interior surface of the film.

With respect to processes using webs, fabrics or pulp, those processes are generally more complicated and, hence, more expensive; they also often produce hazardous metal dust. The resulting films typically have even less transmissivity than metal coatings, but such coating processes also add significant expense. Pulp-type films are conductive through their thickness, and so require additional process steps to insulate their surfaces. As noted by Kato et al., films resulting from these processes further have inferior physical and chemical bonding resulting in low tensile, tear and surface strength.

A thin, conductive filamentary network would overcome many of these problems but it has been difficult in the past to apply such a network without the use of webs or pulp. Breitner notes that applying metal strips is labor intensive, but his process still requires a special prefabricated knit (or special machinery to directly apply filaments to the film). Breitner further notes the difficulties in using very thin conductive filaments, which would be preferable since this would enhance transmissivity through the network. Another problem with static-shielding films using filaments is that the network must be relatively dense, which inhibits transmissivity. For example, Daimon et al. ('027) teaches that the network must have minimum density of 15 g/m$^2$. Finally, sandwiching a conductive network between two polymeric layers often results in wrinkles and/or voids at the interference where the filaments lay. This affects transmissivity and legibility, and may also increase the likelihood of peeling.

Several of the above limitations have been overcome by the process described in U.S. Pat. No. 5,028,490 (D. Koskenmaki), assigned to Minnesota Mining and Manufacturing Co. (3M), assignee of the present invention. In that process, which probably represents the closest prior art, molten strands of conductive material are squirted directly onto a polymeric substrate, which may then be further laminated. Nevertheless, the equipment necessary to produce molten filaments is relatively expensive, and presents clear hazards. Also, since the exemplary laminated films of Koskenmaki create an interface at the filamentary network, they are more likely to have wrinkles and/or voids, and more prone to peeling at the interface. Therefore, it would be desirable and advantageous to manufacture a static-shielding film by applying a very sparse network of thin conductive filaments to a polymeric sheet to achieve improved transmissivity and legibility, the filaments further being suspended in a polymeric layer in such a manner that there is no discernable interface surrounding the filaments even though they form an essentially two-dimensional conductive network. The filaments should further not be applied in a molten state.

SUMMARY OF THE INVENTION

The foregoing objective is achieved by a process in which a plurality of conductive slivers are applied to a sheet material having a dimensionally stable layer and a thermoplastic layer, the thermoplastic layer having a melting temperature which is lower than the melting temperature of the dimensionally stable layer. The slivers are applied to the surface of the thermoplastic layer. A thermoplastic material which is miscible with the thermoplastic layer is then extruded in sheet form, laid over the slivers while the material is still molten, and hot-rolled, causing the extruded sheet and the thermoplastic layer to combine into a single, homogenous layer. The slivers, which may be applied in a pattern or randomly, then form an essentially two-dimensional conductive network which is suspended in the homogenous layer. The slivers may be applied to the sheet material using a mechanical deflector, a magnetic attractor, an electrostatic attractor, or blown onto the surface of the thermoplastic layer when the layer is in a molten state.

BRIEF DESCRIPTION OF THE DRAWINGS

The novel features and scope of the invention are set forth in the appended claims. The invention itself, however, will best be understood by reference to the accompanying drawings, wherein:

DESCRIPTION OF THE PREFERRED EMBODIMENT

Figure 1A:
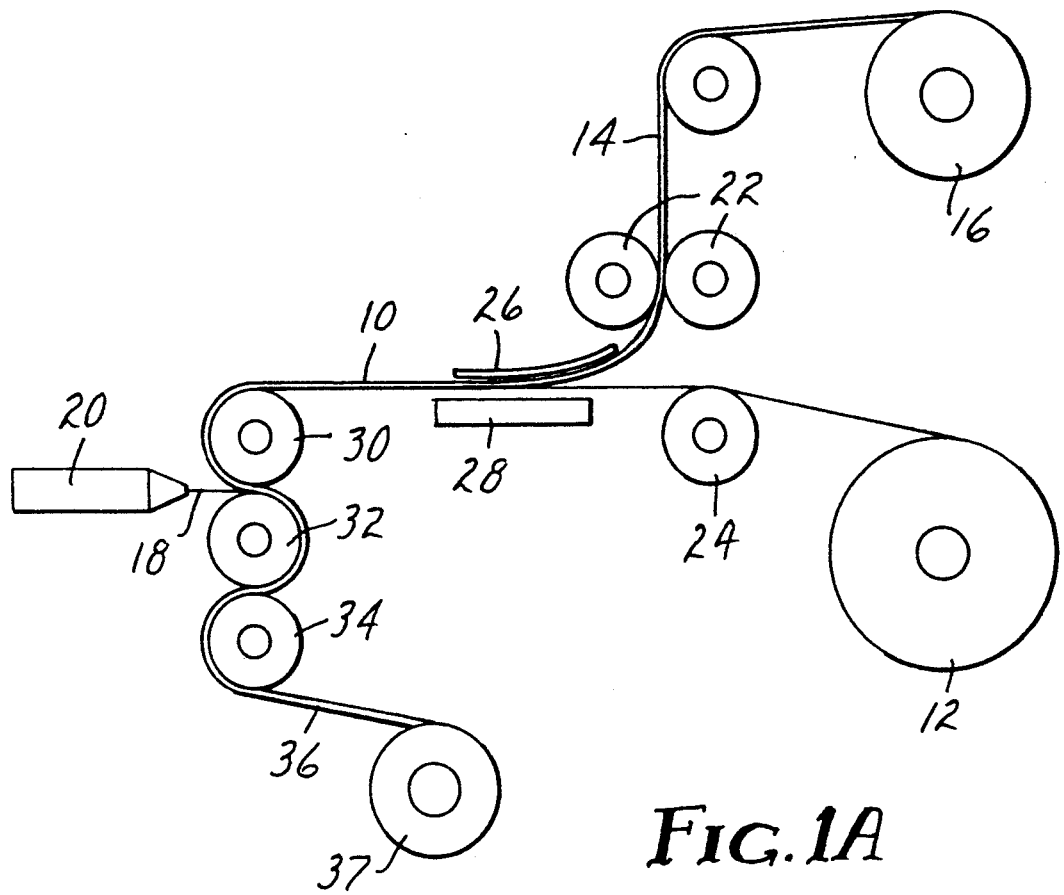
FIGS. 1A and 1B are side elevational views of the process equipment used to manufacture the static-shielding film in accordance with alternative embodiments of the present invention.
Figure 1B:
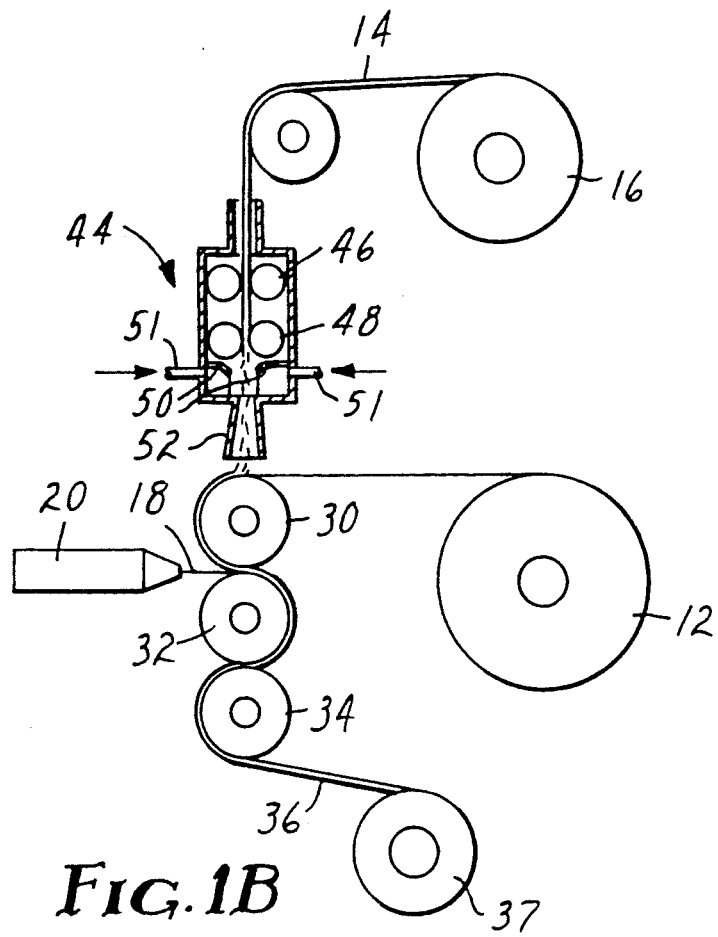

With reference now to the figures, and in particular with reference to FIGS. 1A and 1B, two methods of manufacturing a static-shielding film in accordance with the present invention are depicted. The three basic material components of the film are a sheet material 10 wound on a supply roll 12, a plurality of conductive strands gathered together in a tow 14, Which may be provided on another supply roll 16, and a cover sheet 18 which is extruded from a die 20.

The sheet material 10 comprises a first layer formed of any electrically insulative and flexible carrier material, preferably polymeric, and a second layer formed of a second polymeric material which is electrically insulative, flexible, and thermoplastic. The melting temperature of the second polymeric material should be lower than that of the first polymeric (carrier) material, and both layers should be essentially transparent. In this regard, the term "transparent" means passing at least 70% of visible light. Appropriate polymers for the first polymeric material include, e.g., polyester, polypropylene or nylon. The first polymeric material has preferably been made both biaxially oriented and dimensionally stable, such as by stretching. The second polymeric material may be selected from the exemplary group consisting of low-density polyethylene, linear low-density polyethylene, high density polyethylene, ethylene methyl acrylate, ethylene vinyl acetate, or ethylene ethylacrylate. Sheet material 10 is advantageously very thin, in the range of 30–80 μm. In the preferred embodiment, sheet material ID is a polymeric film known as SCOTCHPAR obtained from 3M, and comprises a first layer of polyethylene terephthalate (PET) and a second layer of polyethylene, the PET layer being about 23 μm thick, and the polyethylene layer being about 20 μm thick, yielding a total thickness of about 43 μm. The width of sheet material 10 may Vary considerably, depending on the intended use of the film, e.g., a small pouch or a large bag. For example, the width may be in the range of 5 cm to several meters.

The tow 14 may comprise a plurality of very long conductive strands, or shorter slivers which are intertwined to form a rope-like tow. The strands or slivers should be very thin, i.e., a diameter no greater than about 12 μm. The strands or slivers may be formed of various metals and alloys, including stainless steel, silver or copper, or may be composite slivers formed of an inorganic filament having a conductive coating thereon. In the preferred embodiment, several identical tows are used which may be obtained from Bekaert Steel Wire Corp. of Marietta, Ga., or Memcor Engineered Materials of Deland, Fla. Each of the tows comprise a plurality of slivers having an average length, depending upon the particular tow, of about 50 mm, 100 mm or 200 mm, the slivers being staggered and intertwined to form a cohesive rope of tow having a diameter in the range of 8-15 mm. These tows have adequate tensile strength to maintain their form if not handled too roughly, i.e., they may be conveyed reasonable distances without tearing or undue stretching. For fabrication of a film having a width of about 30 cm, four such tows are used.

The material for cover sheet 18 is a thermoplastic polymer which may be extruded in sheet form, and may be any of the materials listed above for the second layer of sheet 10. The material for extruded sheet 18 is preferably the same as the second polymeric material used in sheet 10, and should at least be miscible with the second polymeric material, as explained further below. The preferred material for cover sheet 18 is low density polyethylene, and is preferably applied in a thickness in the approximate range of 20–80 μm.

With further reference to FIG. 1A, it can be seen that sliver tow 14 is fed through nip rolls 22 lying above sheet material 10. The nip rolls preferably have a diameter of about 2.5 cm and are placed about 2.5 cm above sheet 10. The nip line is perpendicular to the direction of travel of sheet 10. Sliver tow 14 is fed through nip rolls 22 at a very slow rate with respect to the rate of movement of sheet 10. For example, in order to apply 3 grams of slivers per square meter, using a sliver tow weighing about 0.67 grams per foot, onto a sheet 10 that is one meter wide, the nip rate should be about 1/70th of the rate of travel of sheet 10.

Although the slivers may be applied in a regular pattern (including a grid pattern using a second nip roll to apply a second layer of perpendicular slivers), it is preferable to apply them in a random distribution. In the process embodiment of FIG. 1A, it is necessary to use a sliver tow in which the individual slivers are at least 5 cm long and up to 20 cm in length, as opposed to the embodiment of FIG. 1B in which the slivers or strands should be no longer than about 5 cm. It is also preferable to heat sheet 10 sufficiently to cause the second layer thereof to become tacky (e.g., by using a hot roll 24 which melts the second layer), and thereby improve the adhesion of the slivers to its surface, but this is not necessary. Other means can be used to make the surface of the second layer tacky, such as applying an adhesive, but this may lead to peeling problems. Alternatively, the slivers may become attached to sheet 10 by mechanical means such as a pinch roll or a deflector 26 which forces the slivers into contact with sheet 10. As a further alternative, means may be provided to electromagnetically attract the slivers to sheet 10, such as magnetic or electrostatically charged plate 28 underlying sheet 10. This technique, of course, requires that the slivers be constructed of a magnetic or paramagnetic material.

Figure 2:
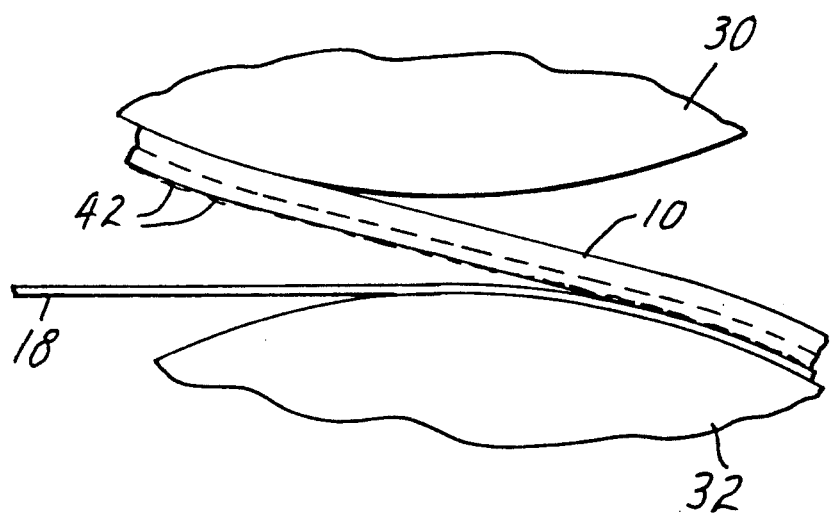
FIG. 2 is an enlarged side elevational view showing the lamination of the sheet material having slivers thereon with the extruded cover sheet.

When the slivers are applied, they form an essentially two-dimensional network, although the slivers do overlap slightly to impart conductivity throughout the network. After the slivers have been deposited on sheet 10, the sheet is fed through a group of three cylinders 30, 32 and 34. If sheet 10 has not been previously heated (as by hot roll 24), then cylinder 30 should be sufficiently hot to cause the second layer of sheet 10 to melt; it should not, however, be so hot as to cause the first layer of sheet 10 to melt. For the previous exemplary materials of PET and polyethylene, the temperature of hot roll 24 (or cylinder 30) should be in the approximate range of 120°-150° C. Extruded cover sheet 18 then bonds easily to the second layer of sheet 10 as they are pressed between cylinders 30 and 32 (see FIG. 2). Cylinders 32 and 34 are preferably chilled to stabilize the resulting film 36. Film 36 may be drawn onto a take-up roll 37.

Figure 3:
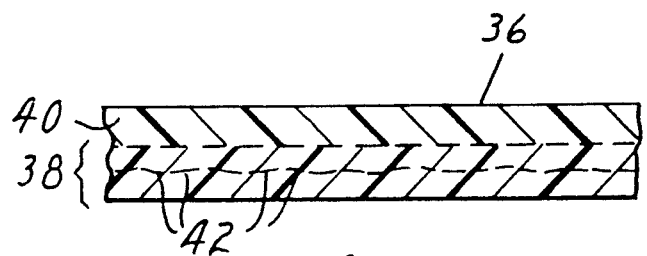
FIG. 3 is a cross-sectional view of the static-shielding film resulting from the process of the present invention.

Referring now to FIG. 3, since the material forming cover sheet 18 is miscible with, and preferably the same as, the second polymeric material of the second layer of sheet 10, the two materials blend together to form a single, homogenous layer 38. This thermoplastic layer 38 is still strongly bound to the first layer 40 of sheet 10. An important feature of the present invention is the manner in which the slivers 42 are suspended in the homogenous layer 38. By applying slivers 42 to a material which is miscible with the material of cover sheet 18, the slivers may be suspended in the resulting single layer without the creation of a discernable interface surrounding the sliver network. This minimizes wrinkles and voids in film 36, and increases the film's integrity. Avoidance of another interface also increases transmissivity.

The only difference between the processes of FIGS. 1A and 1B is the manner in which slivers 42 are applied to sheet 10. In FIG. 1B, slivers 42 are pulled away from tow 14 and blown onto sheet 10 by a feeder-separator 44. This apparatus uses a pair of counterrotating rolls 46 which feed tow 14 through the rolls at a very precise feed rate. A pair of counterrotating accelerator rolls 48, moving at a much faster rate compared to feed rolls 46, pull or pinch off slivers from the tow, which are then blown onto sheet 10 by a venturi-type blower 50 having side walls 52, such as the TRANSVECTOR blower available from Vortec Corp. of Cincinnati, Ohio. Blower 50 is provided with two air hoses 51.

In the preferred embodiment of FIG. 1B, one of the feed rolls 46 is constructed of stainless steel and the other is constructed of rubber; one of the accelerator rolls 48 is also stainless steel and the other is steel with a phenolic coating. Plasma-coated rolls having a very fine knurled surface (but with a hardness of about 80 $R_c$) may have a longer life. Air springs may be used to forcibly urge the roll pairs together, providing an optimum nip force in the range of 20–90 newtons, for both feed rolls 46 and the accelerator rolls 48. The accelerator rolls preferably move at a rate that is around 350 times as fast as the feed rolls. For example, when using slivers having a diameter of about 8 μm, feed rolls 46 may move at a linear feed rate of about 5 cm/minute while accelerator rolls 48 move at a rate of about 1,750 cm/minute. The laminar air flow provided by venturi blower 50 is in the range of 6–30 meters/minute. The air flow could be increased, say up to 150 m/min., if a vacuum screen (not shown) were used to convey the slivers to sheet 10.

Several variations of the above-techniques may be used. For example, the cylinder 30, which may be heated, may also be magnetized in order to further attract slivers 42 and hold them on the second layer of sheet 10. Also, the slivers may be deposited directly onto the extruded sheet 18 rather than on sheet 10. In any event, use of the foregoing techniques for applying a thin sliver network has tremendous cost advantages over other methods, such as metallizing (vapor-coating) the films.

The film 36 resulting from this process provides not only static-shielding, but also shielding against electromagnetic interference (EMI). In order to provide shielding against strong EMI signals, however, it is necessary to provide a more dense sliver network, although the amounts necessary are still much less than that required by prior art techniques. For example, as previously noted, Daimon et al. ('027) teaches that the network must have minimum density of 15 g/m² to provide EMI shielding. A film created in accordance with the present invention requires less than 15 g/m² of slivers to provide equivalent shielding, and preferably has a density of about 10 g/m². If EMI is not a concern, but protection is only required against static electrical fields, then a density of 2 g/m² or less of slivers has proven adequate.

Figure 4:
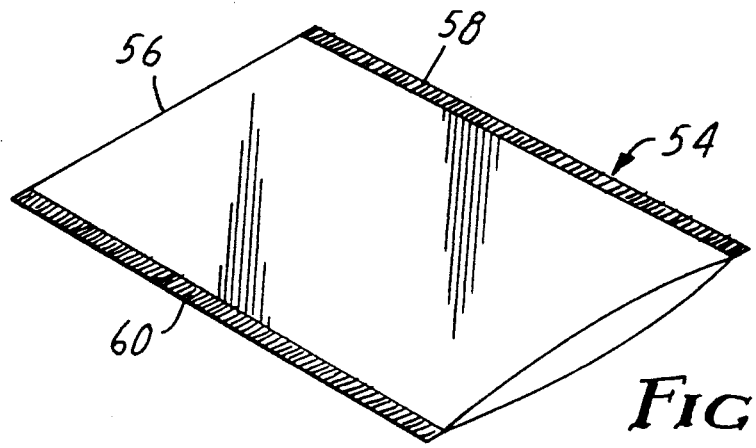
FIG. 4 is a perspective view of a pouch made from the static-shielding film in accordance with the present invention.

Film 36 can be further modified by adding antistatic/static-dissipative agents to the polymeric compounds forming sheets 10 and 18, or by coating (using conventional techniques) the outer surfaces of film 36 with such agents. Such agents are well known and include, e.g., quaternary ammonium compounds. The preferred antistatic compound is one sold by 3M under the brand name FC170C (an octoperfluoro polyether sulfonamide), and is volume-loaded into the film in an amount in the range of 0.1%–0.4% by weight. Whether the antistat is loaded or coated, transmissivity of film 36 is still at least 70%, and tests have shown that films made in accordance with the foregoing processes have transmissivity levels as high as 85%. Furthermore, film 36 can protect not only electronic components, but also any materials or instruments which may be sensitive to electric fields/discharge, including chemicals and pharmaceuticals. Film 36 may be formed into a variety of packages, such as the pouch 54 shown in FIG. 4. Pouch 54 is formed by longitudinally folding film 36, forming a side 56, and simultaneously heat sealing the film along two lines 58 and 60 transverse to the length of film 36 and cutting film 36 at sides 58 and 60. In this regard, one of the two polymeric materials used in sheet 10 should be heat-sealable (e.g., polyethylene). Those skilled in the art will appreciate the many other uses for film 36.

Although the invention has been described with reference to specific embodiments, this description is not meant to be construed in a limiting sense. Various modifications of the disclosed embodiment, as well as alternative embodiments of the invention, will become apparent to persons skilled in the art upon reference to the description of the invention. For example, there are several alternative methods for applying the slivers from tow 14 to sheet 10 which are not discussed herein. Also, the first layer of sheet material 10 may comprise a carrier which is releasable from the polymeric material forming the second layer thereof. Finally, the resulting film 36 has other uses besides electrostatic shielding, such as a susceptor for microwave ovens. It is therefore contemplated that the appended claims will cover such modifications that fall within the true scope of the invention.

We claim:

1. A method of making a film which provides static shielding, the method comprising the steps of:

obtaining a first sheet having first and second layers, said first layer formed of a carrier material which is electrically insulative, flexible and transparent, and said second layer formed of a polymeric material which is electrically insulative, flexible, transparent, and thermoplastic, the melting temperature of said polymeric material being lower than that of said carrier material;

applying a plurality of conductive slivers to said second layer of said first sheet, forming an essentially two-dimensional, conductive network on said second layer, said slivers having a melting temperature above said melting temperature of said polymeric material; and laminating a second sheet to said second layer of said first sheet, said second sheet being in a molten state and formed of a material which is miscible with said polymeric material whereby, as said second sheet is laminated to said second layer, said second sheet and said second layer become a homogenous, single layer, said conductive network being suspended in said homogenous layer.

2. The method of claim 1 wherein said slivers are constructed of a magnetic or paramagnetic material, and said applying step comprises the steps of:

providing means for electromagnetically attracting said slivers;

feeding said first sheet over said attracting means, with said second layer of said first sheet facing upwards; and laying said slivers onto said second layer proximate said attracting means.

3. The method of claim 1 wherein said applying step comprises the steps of:

drawing said first sheet over a cylinder with said first layer of said first sheet contacting said cylinder, said cylinder being sufficiently hot to melt said second layer of said first sheet;

feeding a tow of sliver material through first and second pairs of counterrotating rolls, said second pair of rolls rotating faster than said first pair of rolls, whereby said slivers are pulled away from said tow at said second roll; and blowing said slivers onto said melted second layer of said first sheet.

4. The method of claim 1 wherein said applying step comprises the steps of:

providing mechanical means for deflecting said slivers toward said first sheet;

feeding said first sheet over said deflecting means, with said second layer of said first sheet facing upwards; and laying said slivers onto said second layer proximate said deflecting means.

5. The method of claim 1 wherein said second layer of first sheet is also in a molten state during said laminating step.

6. The method of claim 1 wherein said slivers are applied to said second layer of said first sheet in an amount not exceeding about 15 g/m$^2$.

7. The method of claim 1 wherein said slivers are applied to said second layer of said first sheet in an amount not exceeding about 2 g/m$^2$.

8. The method of claim 1 wherein said carrier material is polymeric and is stretched prior to forming said first sheet whereby said carrier material is biaxially oriented and dimensionally stable.

9. The method of claim 1 further comprising the step of mixing an antistatic agent with either said carrier material in said first sheet or said polymeric material in said second sheet.

10. The method of claim 1 further comprising the step of coating either said first layer of said first sheet or said homogenous layer with an antistatic agent.

11. The method of claim 1 further comprising the step of forming said film into a package by:

folding said film to define a folded edge;

heat sealing said film along two lines which are generally perpendicular to said folded edge, forming two heat-sealed edges; and cutting said film at said heat-sealed edges.

12. A film made in accordance with claim 1, said film passing at least 70% of visible light.

13. A method of making a film which provides static shielding, the method comprising the steps of:

obtaining a first sheet having first and second layers, said first layer formed of a first polymeric material which is electrically insulative, flexible, transparent and dimensionally stable, and said second layer formed of a second polymeric material which is electrically insulative, flexible, transparent, and thermoplastic, the melting temperature of said second polymeric material being lower than that of said first polymeric material;

drawing said first sheet over a first cylinder with said first layer of said first sheet contacting said first cylinder, said first cylinder being sufficiently hot to melt said second layer of said first sheet;

feeding a tow of sliver material through a pair of feed rolls and a pair of accelerator rolls, said pair of accelerator rolls rotating faster than said pair of feed rolls;

blowing said slivers onto said meted second layer of said first sheet, forming an essentially two-dimensional, conductive network on said second layer, said slivers having a melting temperature above said melting temperature of said second polymeric material; and laminating a second sheet to said second layer of said first sheet, said second sheet being in a molten state and formed of said second polymeric material whereby, as said second sheet is laminated to said second layer, said second sheet and said second layer become a homogenous, single layer, said conductive network being suspended in said homogenous layer.

14. The method of claim 13 further comprising the step of magnetizing said first cylinder whereby said slivers are attracted to said second layer of said first sheet.

15. The method of claim 13 further comprising the step of rolling said laminated first and second sheets through chilled cylinders to stabilize the film.

16. The method of claim 13 further comprising the step of either (i) mixing an antistatic agent with either said first polymeric material in said first sheet or said material in said second sheet, or (ii) coating either said first layer of said first sheet or said homogenous layer with an antistatic agent.

17. The method of claim 13 wherein said slivers are applied to said second layer of said first sheet in an amount not exceeding about 2 g/m$^2$.

18. The method of claim 13 wherein said blowing step is performed using a venturi-type blower which creates laminar air flow towards said melted second layer of said first sheet.

19. A film made in accordance with claim 13, said film passing at least 70% of visible light.

20. A method of making an antistatic, static-shielding, flexible and transparent film, comprising the steps of:

obtaining a first sheet having first and second layers, said first layer formed of biaxially oriented, dimensionally stable polymer selected from the group consisting of polyethylene terephthalate, polypropylene or nylon, and said second layer formed of a thermoplastic polymer selected from the group consisting of low-density polyethylene, linear low-density polyethylene, high density polyethylene, ethylene methyl acrylate, ethylene vinyl acetate, or ethylene ethylacrylate, said first sheet having a thickness no greater than about 80 μm;

drawing said first sheet over a first cylinder with said first layer of said first sheet contacting said first cylinder, said first cylinder being sufficiently hot to melt said second layer of said first sheet, and further being magnetized;

feeding a tow of stainless steel slivers through a pair of feed rolls and a pair of accelerator rolls, said pair of accelerator rolls rotating faster than said pair of feed rolls;

blowing said slivers onto said melted second layer of said first sheet, forming an essentially two-dimensional, conductive network on said second layer, said network having a density not exceeding 2 g/m$^2$; and extruding a second sheet onto said second layer of said first sheet, said second sheet having a thickness no greater than about 80 μm, being in a molten state, and formed of said thermoplastic polymer whereby, as said second sheet is extruded onto said second layer, said second sheet and said second layer become homogenous, single layer, said conductive network being suspended in said homogenous layer.

* * * * *